United States Patent
Yamada

(10) Patent No.: US 6,839,279 B2
(45) Date of Patent: Jan. 4, 2005

(54) NONVOLATILE SEMICONDUCTOR MEMORY DEVICE

(75) Inventor: Shigekazu Yamada, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/455,310

(22) Filed: Jun. 6, 2003

(65) Prior Publication Data

US 2004/0246784 A1 Dec. 9, 2004

(51) Int. Cl.[7] .............................................. G11C 16/06
(52) U.S. Cl. ........................... 365/185.2; 365/185.21; 365/185.22; 365/185.03; 365/185.28
(58) Field of Search .......................... 365/185.2, 185.21, 365/185.22, 185.28, 185.03

(56) References Cited

U.S. PATENT DOCUMENTS

| | | | | |
|---|---|---|---|---|
| 5,258,958 A | * | 11/1993 | Iwahashi et al. | 365/185.21 |
| 6,501,674 B2 | * | 12/2002 | Ashikaga | 365/145 |
| 6,639,849 B2 | * | 10/2003 | Takahashi et al. | 365/189.09 |

* cited by examiner

Primary Examiner—Hoai Ho
(74) Attorney, Agent, or Firm—Arent Fox PLLC

(57) ABSTRACT

A nonvolatile semiconductor memory device comprises a memory cell array which includes memory cells and reference cells, the reference cells including a first reference cell and a second reference cell. A data judging control unit generates an average reference current based on a first reference current from the first reference cell and a second reference current from the second reference cell, and determines data of each of the memory cells by comparison of a read-out current of each memory cell with the average reference current. A control unit performs a program verification operation to each memory cell. A compensation current supplying unit supplies a compensation current to a bit line of a target memory cell when a leak current of a neighboring memory cell adjacent to the target memory cell exceeds a predetermined reference value during the program verification operation.

8 Claims, 7 Drawing Sheets

NONVOLATILE SEMICONDUCTOR MEMORY DEVICE

BACKGROUND OF THE INVENTION

1. Field of the Invention

The present invention generally relates to a nonvolatile semiconductor memory device, and more particularly to a nonvolatile semiconductor memory device which uses a ferroelectric capacitor as a memory element at the time of read-out operation.

2. Description of the Related Art

In a nonvolatile semiconductor memory device, such as a flash memory, a reference current, read from a reference cell therein, is set to a predetermined threshold level (or a fixed reference level), and at the time of read-out operation, a drain current from a memory cell accessed therein is read out as the data, and the read-out current of the memory cell is compared with the reference current of the reference cell. The determination as to whether the data is "1" or "0" is performed depending on whether the read-out current is higher than the reference current or not.

When the number of times of rewriting the memory cell in the nonvolatile semiconductor memory device increases, the charge loss in which the writing charge is lacked will occur, and it is in the tendency for the threshold level of the memory cell in the core memory area to become small. On the other hand, the rewriting operation is not normally performed to the reference cells in the reference cell area, and the fixed reference voltage from the reference cells will remain unchanged. For this reason, when the number of times of rewriting increases, the read-out operation is not properly executed with the fixed threshold voltage of the reference cell, and only an inadequate read-out margin is left for the read-out operation.

There is a reference cell setting technique that is used to secure an adequate read-out margin. In this technique, the two reference cells with respect to the data "1" and "0" are provided in the memory cell array as the reference cells for read-out operation. The average of the reference current values from the two reference cells is obtained. The rewriting operation is performed to the reference cells, similar to the memory cells in the core cell area of the memory cell array. Namely, the reference cell REF-0 and the reference cell REF-1 are respectively provided for the data "0" which corresponds to the cell in the programmed state and the data "1" which corresponds to the cell in the erased state. The average of the reference current values from the two reference cells is obtained by reading the drain current from each of the reference cells REF-0 and REF-1, and it is used as the reference level for the data discrimination.

In the case of the above-described technique, the REF-0 is programmed like the memory cell using the reference cell PrRef for program verification check that is set to a predetermined threshold level. In the program verification check, the reference current from the reference cell PrRef for program verification and the read-out current from the memory cell being written thereto are compared. When the read-out current from the memory cell reaches the threshold level that is higher than the reference current, the rewriting operation is ended.

Therefore, only the lower limit is set up for the threshold level of the reference cell REF-0 programmed in the above manner, and it is uncertain whether the actually set threshold level is appropriate. Similarly, only the upper limit is set up for the threshold level of the reference cell REF-1 programmed in the above manner, and it is uncertain whether the actually set threshold level is appropriate.

Hence, the threshold level of the reference cell has the probability distribution with the spread of the amplitude depending on the writing/erasing characteristics. The distribution of the threshold level of the virtual read-out reference cell which is the average of the reference current values from the two reference cells has significant influence on the read-out margin.

When the threshold level of the virtual read-out reference cell is relatively high, the threshold difference with the data "0" of the memory cell becomes small, and the read-out margin on the side of "0" becomes small.

When the threshold level of the virtual read-out reference cell is relatively low, the threshold difference with the data "1" of the memory cell becomes small, and the read-out margin on the side of "1" becomes small.

Accordingly, variations exist in the threshold level of each reference cell depending on the characteristics of the writing and erasing of the reference cell when the average of the reference currents of the two reference cells is obtained as the reference level, variation will arise also on the reference current which is the average of the reference currents of the two reference cells, and the read-out margin will become unstable.

Meanwhile, a nonvolatile semiconductor memory device such as an ordinary flash memory has the configuration in which a plurality of memory cells are arranged in row and columns each memory cell using polysilicon etc. as the floating gate.

On the other hand, a flash memory which is configured by using the two-bit-per-cell technology has been developed and it is going to be put in practical use. In such memory device, 2 bits of information are stored in the memory cell by trapping the charge in a layer of a silicon nitride film or the like. Hereinafter, each memory cell of such flash memory is called a double bit cell.

Japanese Laid-Open Patent Application No. 2001-156272 discloses a non-volatile semiconductor memory device (flash memory) which implements the two-bit-per-cell technology using a charge-trap layer.

FIG. 1 shows the structure of a double bit cell.

In the flash memory of this type, for example, a charge-trap layer is provided between the control gate and the substrate for each memory cell, and the trap layer is comprised of a silicon oxide film, a silicon nitride film and a silicon oxide film which are stacked together in this order. Two bits of information, or the data "1" and the data "0", are stored in the memory cell by trapping the charge in the layer of the silicon nitride film. The threshold level of the memory cell is varied depending on whether the charge is trapped or not, and the readout current is distinguished between the data "0" and the data "1". In this case, the trap layer, such as silicon nitride, is an insulating film, and the charge is not transferred from the trap layer. Therefore, storing two bits of information per cell is possible by trapping the charge at the ends of the trap layer independently. The two bits of information can be separately read by changing the drain and the source of the cell transistor at the time of read-out operation respectively.

In the flash memory of the above type, when performing a program verification operation of the target memory cell, the leak current will occur in the neighboring memory cell that is adjacent to the target memory cell and connected to the common word line. In the program verification mode, as the program verification current flows to the target memory cell, a voltage is applied to the common word line for the target memory cell and its neighboring memory cell. Hence, the leak current will occur in the neighboring memory cell due to the applied voltage.

If the leak current occurs, it is difficult to correctly detect the exact magnitude of the program verification current of the target memory cell.

FIG. 2 is a diagram for explaining the leak current generated in the neighboring memory cell adjacent to the target memory cell in a conventional nonvolatile semiconductor memory device.

Suppose that the memory cell array of the nonvolatile semiconductor memory device of FIG. 2 is arranged so that a plurality of memory cells, such as memory cells 61, 62, 63 and 64, are connected to the common word line.

Each memory cell has the same configuration as the memory cell of FIG. 1, and the nonvolatile semiconductor memory device of FIG. 2 is configured by using the two-bit-per-cell technology described above.

For the sake of convenience of description, the case in which the bit line A side of the memory cell 61 of FIG. 2 is made into the program verification state is considered. On the other hand, however, it is possible to consider the case in which the bit line B side of the memory cell 61 of FIG. 2 is made into the program verification state in the same way as described below.

In the example of FIG. 2, after the application of a program pulse, the bit line A side of the memory cell 61 is made into the program verification state. The verification current will flow, in the direction of the arrow indicated in FIG. 2, to the bit line A side of the target memory cell 61.

Suppose that the bit line A of the target memory cell 61 is set to a ground voltage (Vss).

When the magnitude of the verification current is smaller than the predetermined reference current, the data stored in the bit line A side of the target memory cell 61 is correctly read out by the sense amplifier 32.

At this time, when the bit lines C and D of the neighboring memory cell 62, the bit lines E and F of the neighboring memory cell 63, and the bit lines G and H of the neighboring memory cell 64 are set in the erased state, the leak current flows, in the direction of the arrow indicated in FIG. 2 that is opposite to the direction of the verification current, to the neighboring memory cell 62 and others connected to the common word line, because the word line of the target memory cell 61 is activated.

Therefore, it is difficult to read correctly the exact magnitude of the verification current of the target memory cell 61 with the sense amplifier 32 because of the influence of the leak current generated in the neighboring memory cell 62.

The influence of the leak current of the neighboring memory cell 62 is given to the conventional nonvolatile semiconductor memory device without compensation, and the determination result of data is not reliable at the time of the comparison of the read-out current and the reference current.

SUMMARY OF THE INVENTION

An object of the present invention is to provide an improved nonvolatile semiconductor memory device in which the above-described problems are eliminated.

Another object of the present invention is to provide a nonvolatile semiconductor memory device which is configured to use the average current of the two reference cells as the reference current, and provides a pattern dependence compensation method which enables detection of exact program verification current of the target memory cell without being significantly affected by the leak current generated in the neighboring memory cell adjacent to the target memory cell.

The above-mentioned object of the present invention is achieved by a nonvolatile semiconductor memory device comprising: a memory cell array including memory cells and reference cells, the reference cells including a first reference cell and a second reference cell; a data judging control unit generating an average reference current based on a first reference current supplied from the first reference cell and a second reference current supplied from the second reference cell, the data judging control unit determining data of each of the memory cells by comparison of a read-out current of each of the memory cells with the average reference current; a control unit performing a program verification operation to each memory cell of the memory cell array; and a compensation current supplying unit supplying a compensation current to a bit line of a target memory cell of the memory cell array when a leak current of a neighboring memory cell adjacent to the target memory cell exceeds a predetermined reference value during the program verification operation of the control unit to the target memory cell, the compensation current compensating the leak current of the neighboring memory cell.

In the nonvolatile semiconductor memory device of the present invention, when the leak current of the neighboring memory cell adjacent to the target memory cell exceeds the predetermined reference value during the program verification operation performed to the target memory cell, the compensation current for compensating the leak current is supplied to the bit line of the target memory cell.

Therefore, according to the present invention, in the nonvolatile semiconductor memory device that is configured to use the average current of the two reference cells as the reference current, the influence by the leak current generated in the neighboring memory cell can be effectively reduced, and the detection of the exact program verification current of the target memory cell is possible.

BRIEF DESCRIPTION OF THE DRAWINGS

Other objects, features and advantages of the present invention will become apparent from the following detailed description when read in conjunction with the accompanying drawings.

DETAILED DESCRIPTION OF PREFERRED EMBODIMENTS

A description will now be given of preferred embodiments of the present invention with reference to the accompanying drawings.

Figure 4:
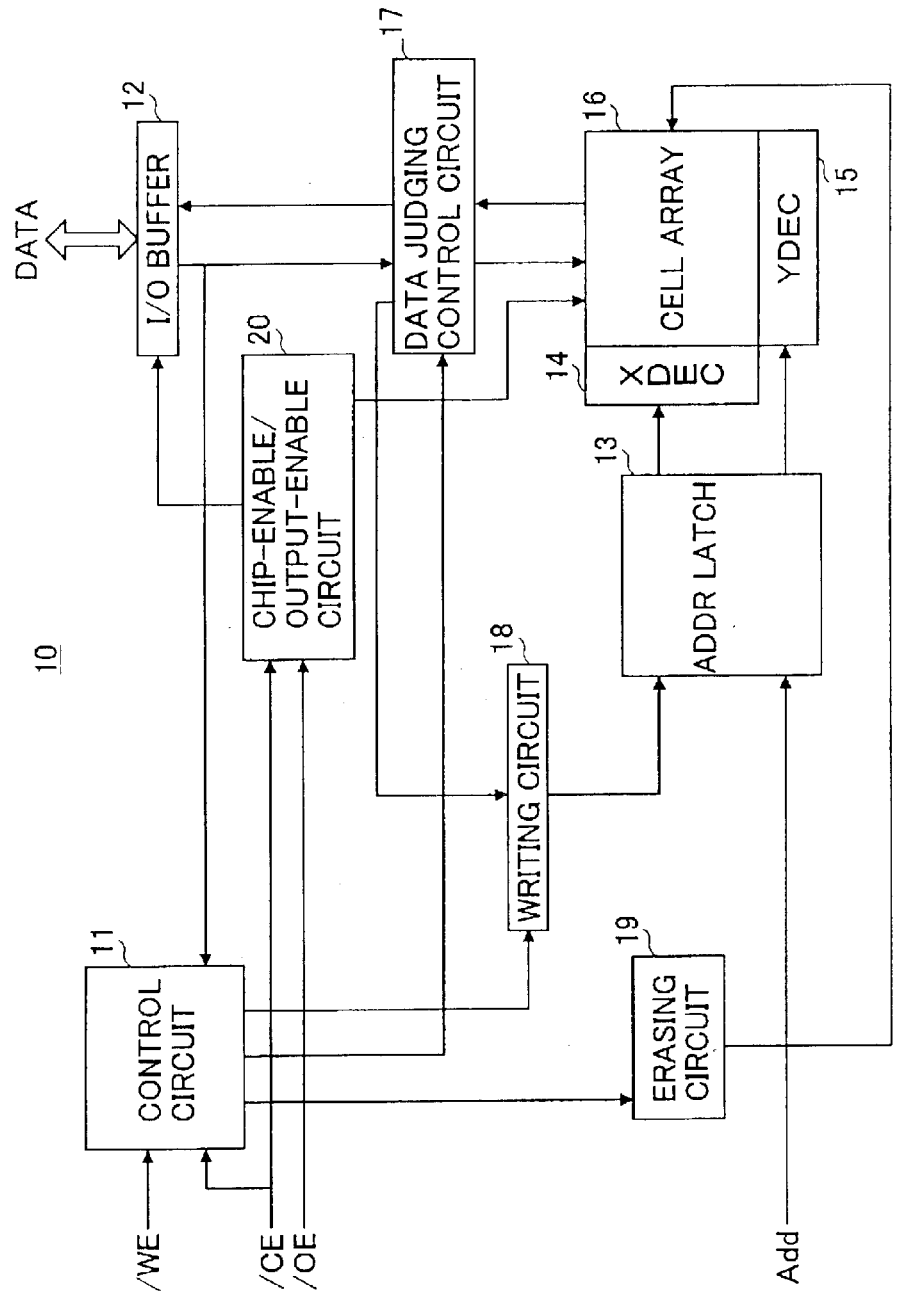
FIG. 4 is a block diagram showing the configuration of the nonvolatile semiconductor memory device of one preferred embodiment of the present invention.

FIG. 4 shows the nonvolatile semiconductor memory device to which one preferred embodiment of the present invention is applied.

As shown in FIG. 4, the nonvolatile semiconductor memory device 10 of the present embodiment generally includes a control circuit 11, an I/O (input/output) buffer 12, an address latch 13, an X decoder (XDEC) 14, a Y decoder (YDEC) 15, a memory cell array 16, a data judging control circuit 17, a writing circuit 18, an erasing circuit 19, and a chip-enabling/output-enabling circuit 20.

The control circuit 11. receives the externally supplied control signals (/WE, /CE), operates as a state machine based on the received control signals, and controls operation of each of the respective elements of the nonvolatile semiconductor memory device 10.

The input/output buffer 12 receives the externally supplied data, and supplies the received data to the data judging control circuit 17.

The address latch 13 receives and latches the externally supplied address signal (ADDR), and supplies the received address signal to the X decoder 14 and the Y decoder 15.

The X decoder 14 decodes the address signal supplied from the address latch 13, and selectively activates the word lines of the memory cell array 16 based on the decoded address signal.

The Y decoder 15 decodes the address signal supplied from the address latch 13, selectively activates the bit lines of the memory cell array 16 based on the decoded address signal, and supplies the read-out data to the data judging control circuit 17.

Figure 1:
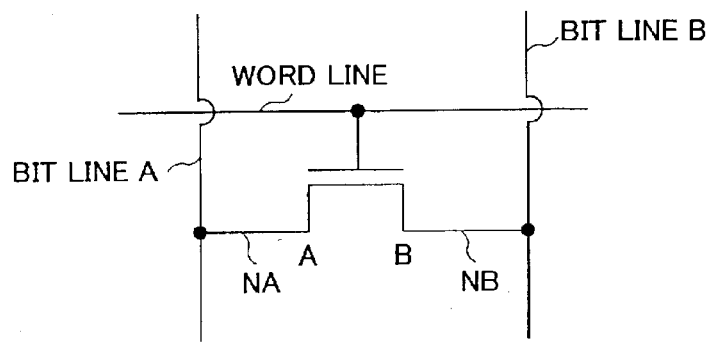
FIG. 1 is a diagram showing the structure of a double-bit cell.

The memory cell array 16 includes a plurality of memory cells which are arranged in rows and columns in a two-dimensional formation, and each memory cell configured to store 2 bits of information per one cell, or having the two-bit-per-cell composition. Moreover, the memory cell array 16 includes the array of memory cell transistors, the word lines and the bit lines connected to the respective memory cell transistors. Each memory cell of the memory cell array 16 stores data into the related memory cell transistor as shown in FIG. 1.

At the time of read-out operation, the data from the memory cell specified by the activated word line is read out to the corresponding bit line. Moreover, at the time of the programming operation or the erasing operation, the operation of charge pouring to the memory cell or the operation of charge removal from the memory cell is performed by setting the word line and the bit line to a suitable potential according to each operation.

The data judging control circuit 17 receives the read-out current from the memory cell, which is specified in the memory cell array 16 by the Y decoder 15 and the X decoder 14, compares the read-out current with the reference current which is the average of the reference current values of the two reference cells. The data judging control circuit 17 determines whether the data is "0" or "1" based on the comparison result. The result of the data discrimination is supplied from the data judging control circuit 17 to the input/output buffer 12 as the read-out data.

The verification checks, accompanied with the programming operation or the erasing operation, are performed by comparing the read-out current from the memory cell, which is specified among the memory cell array 16 by the Y decoder 15 and the X decoder 14, with the reference current (or the reference level) which is supplied from one of the reference cells for program verification checks or the reference cells for erase verification checks.

In the nonvolatile semiconductor memory device of the present embodiment, the reference cells for the read-out data discrimination are provided within the memory cell array 16. These reference cells are provided as dynamic reference cells which are capable of rewriting operation like the memory core cells. Moreover, the reference cells for program verification checks and the reference cells for erase verification checks are provided outside the memory cell array 16. These reference cells are provided, for example, in the data judging control circuit 17, and they are the reference cells having a fixed threshold level.

Based on the writing data supplied, under the control of the control circuit 11, from the input/output buffer 12 to the data judging control circuit 17, the writing circuit 18 drives the address latch 13, the X decoder 14, and the Y decoder 15, so that the writing circuit 18 performs data writing operation to the memory cell array 16.

The erasing circuit 19 generates a suitable potential applied to the word line and the bit line at the time of erasing operation, and performs the erasing operation to the memory cell array 16 on the basis of the sector unit.

The chip-enabling/output-enabling circuit 20 receives the chip enable signal ICE and the output enable signal /OE from the external equipment (not shown) as the control signals, and controls activation/deactivation of the input/output buffer 12 and the memory cell array 16 in accordance with the received control signals.

Figure 5:
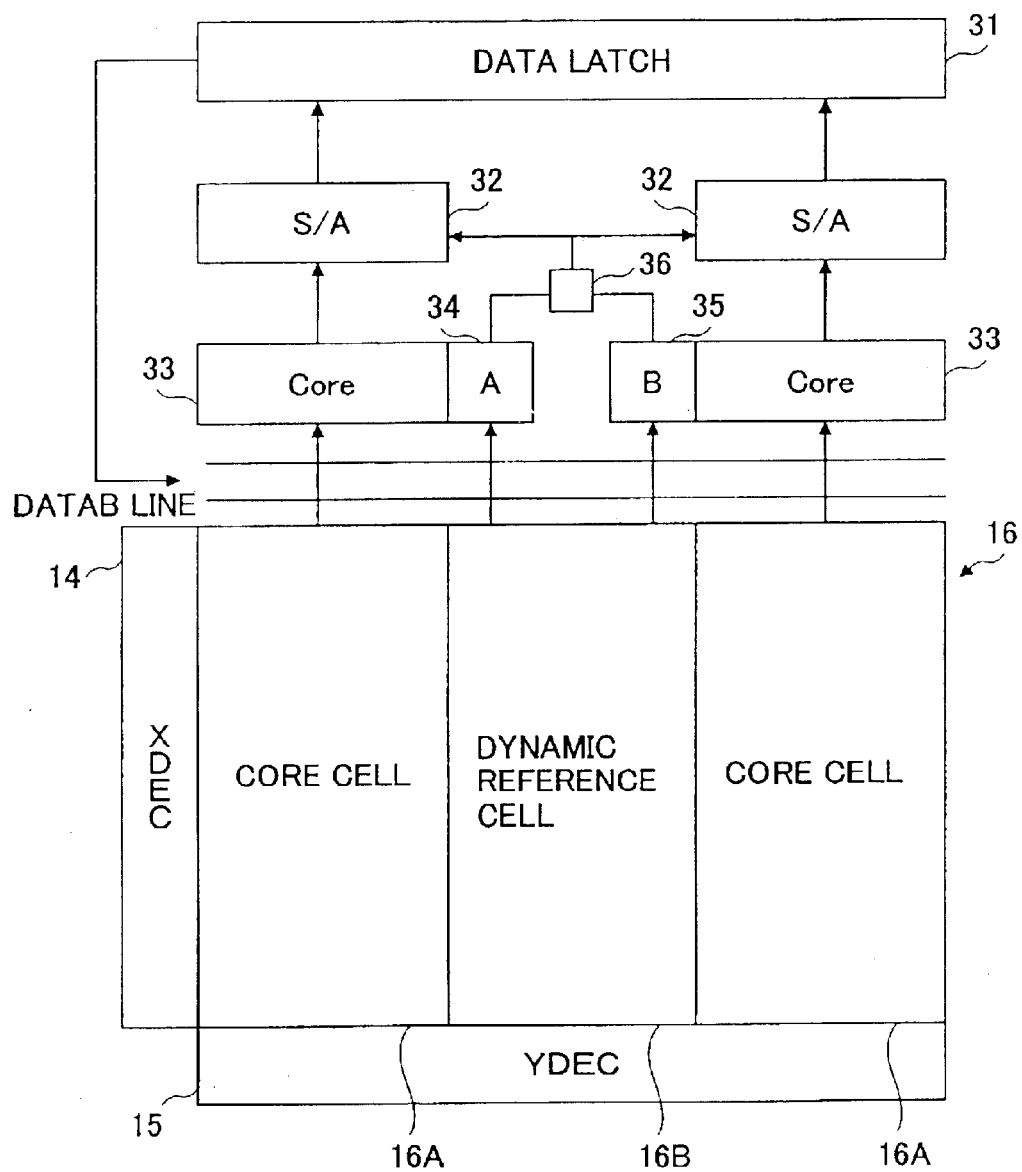
FIG. 5 is a diagram for explaining the circuit configuration of the nonvolatile semiconductor memory device of FIG. 4 which is related to the read-out operation.

FIG. 5 shows the circuit configuration of the nonvolatile semiconductor memory device of FIG. 4 which is related to data read-out operation.

The circuit configuration of FIG. 5 generally includes the data latch 31, the sense amplifiers (S/A) 32, the cascode circuits 33 for the core cells, the cascode circuit 34 for the reference cell A, the cascode circuit 35 for the reference cell B, and the average voltage calculation circuit 36. These components are used to performs the discrimination of the data read from the memory cell array 16. These components of the circuit configuration of FIG. 5 are equivalent to the data judging control circuit 17 in the nonvolatile semiconductor memory device of FIG. 4.

The memory cell array 16 includes the core cell area 16A which contains the core cells, and the reference cell area 16B which contains the dynamic reference cells.

The read-out current from one of the core cells of the core cell area 16A is converted into a corresponding voltage signal by the cascode circuit 33. The voltage signal is supplied from the cascode circuit 33 to the sense amplifier 32.

Moreover, the reference current read from the reference cell A of the dynamic reference cell area 16B is converted into a voltage signal by the cascode circuit 34 for the reference cell A. Similarly, the reference current read from the reference cell B of the dynamic reference cell area 16B is converted into a voltage signal by the cascode circuit 35 for the reference cell B.

The average voltage calculation circuit 36 generates the average voltage of the two reference voltages outputted by the cascode circuit 34 and the cascode circuit 35, and supplies the generated average voltage to the sense amplifier 32.

With the sense amplifiers 32, the data judging control circuit 17 determines whether the data is "1" or "0" by comparing the read-out voltage level with the average voltage of the two reference voltages. The determination result is supplied to the data latch 31.

Figure 3:
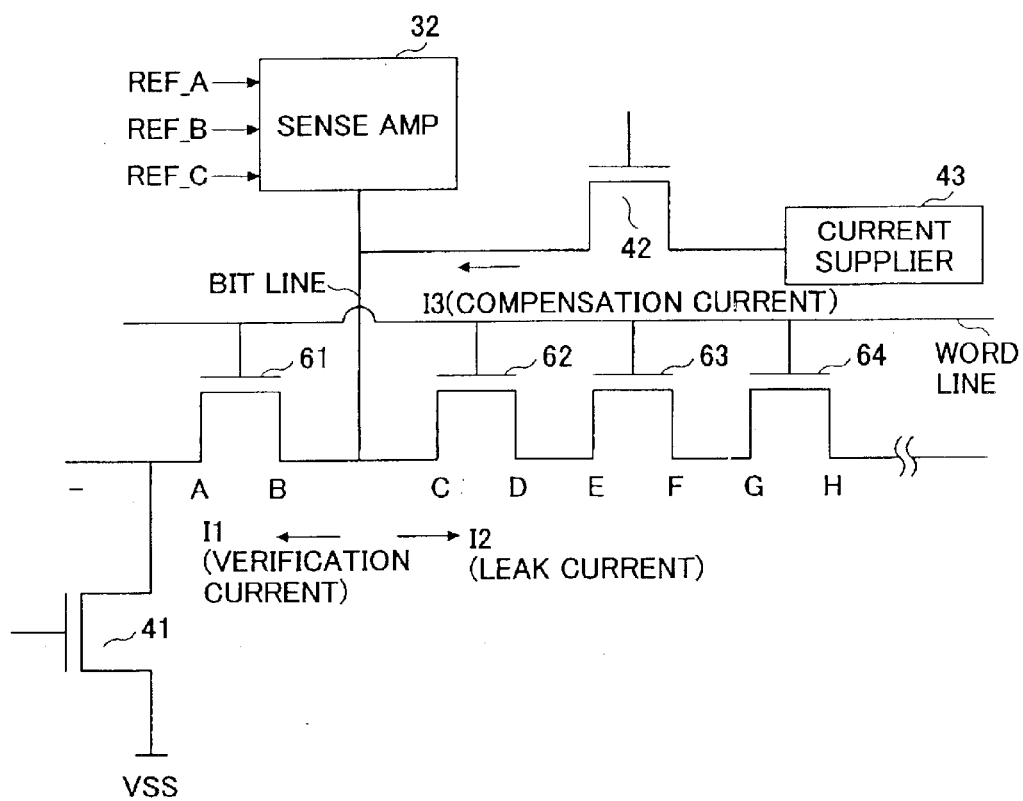
FIG. 3 is a diagram for explaining the pattern dependence compensation method of the present invention.

FIG. 3 is a diagram for explaining the pattern dependence compensation method of the present invention.

Figure 2:
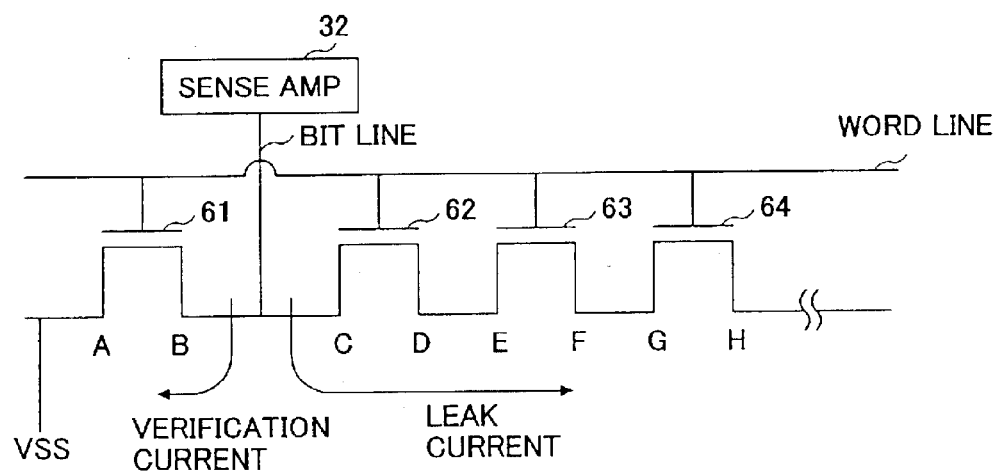
FIG. 2 is a diagram for explaining the leak current of the adjoining memory cell in a conventional nonvolatile semiconductor memory device.

Similar to FIG. 2, in the memory cell array of the nonvolatile semiconductor memory device of FIG. 3, a plurality of memory cells 61, 62, 63 and 64 which are connected to the common word line are arranged. Each memory cell has the same configuration as the memory cell of FIG. 1, and the nonvolatile semiconductor memory device of FIG. 3 is configured by using the two-bit-per-cell technology.

Moreover, in the nonvolatile semiconductor memory device of FIG. 3, the transistor 41 connected to the bit line A side of the target memory cell 61, the transistor 42 connected to the bit line between the target memory cell 61 and the sense amplifier 32, and the current supplying circuit (current supplier) 43 connected to the transistor 42 are provided. One end of the transistor 41 is set to a ground voltage (Vss).

Moreover, the program-verification reference cells (not shown in FIG. 3) according to the present invention are reference cells which are provided outside the memory cell array 16 (which are provided, for example, in the data judging control circuit 17), and each program-verification reference cell has a fixed threshold value.

In the pattern dependence compensation method of the present invention, three reference cells for program verification (which will be called the reference cell A, the reference cell B, and the reference cell C), each having a predetermined threshold value (reference level), are provided in the data judging control circuit 17.

The reference level (or the threshold value) of each of the above-mentioned reference cells. A, B, and C is set up as follows.

The reference level of the reference cell A is set up so that it supplies the first reference voltage (REF_A) to the sense amplifier 32 through the cascode circuit (not shown) as the reference level (Vth).

The reference level of the reference cell B is set up so that it supplies the target reference voltage (REF_B) to the sense amplifier 32 through the cascode circuit (not shown) as the reference level (Vth).

The difference (delta_V) between the first reference voltage REF_A and the target reference voltage REF_B is set up so that it may become a sufficiently small value (REF_A=REF_B−delta_V).

The reference cell C is used when detecting the leak current of the neighboring memory cell, and the reference level of the reference cell C is set up so that it supplies the reference voltage (REF_C) for detection to the sense amplifier 32 through the cascode circuit (not shown) as the reference level (Vth).

In order to detect the leak current of the neighboring memory cell, the magnitude of the reference voltage REF_C for detection is set up so that it may become a sufficiently small value.

In the program verification mode, the control circuit 11 reads the reference level (Vth) from one of these reference cells A, B and C, and supplies it to the sense amplifier 32 through the cascode circuit (not shown).

Namely, the control circuit 11 supplies to the sense amplifier 32 one of the first reference voltage (REF_A), the target reference voltage (REF_B) and the reference voltage (REF_C) for detection, as one of the reference levels.

Under the control of the control circuit 11, the verification operation, accompanied with the program operation, is performed by the data judging control circuit 17 as follows. The verification operation is performed by comparison of the readout current of the data, supplied from one of the memory cells in the memory cell array 16 specified by the Y decoder 15 and the X decoder 14, and the reference current indicated by the program-verification reference cell (any specified one of the reference cells A, B, and C).

In the pattern dependence compensation method of FIG. 3, the case in which the bit line A side of the target memory cell 61 is made into the program verification state is considered.

However, the case in which the bit line B side of the memory cell 61 of FIG. 3 is made into the program verification state can also be considered in the same way.

In the first procedure of the pattern dependence compensation method of FIG. 3, the memory cell 61 (the target memory cell) is programmed so that the first reference voltage REF_A (=REF_B−delta_V) which is lower than the target reference voltage REF_B is obtained.

Figure 6:
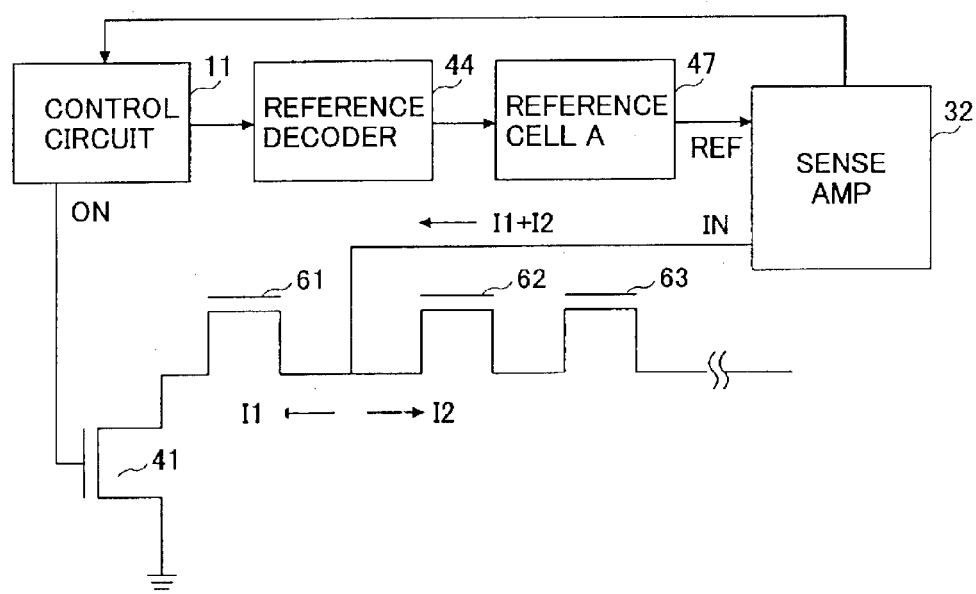
FIG. 6 is a diagram for explaining the first procedure of the pattern dependence compensation method of one preferred embodiment of the present invention.

FIG. 6 is a diagram for explaining the first procedure of the pattern dependence compensation method of the present embodiment. Suppose that the reference cell decoder 44, the reference cell A 45, and the sense amplifier 32 in FIG. 6 are provided in the data judging control circuit 17 of FIG. 4.

In the first procedure, the control circuit 11 sets the control signal supplied to the gate of the transistor 41, in the ON state, and activates the word line and the bit line of the target memory cell 61 through the X decoder 14 and the Y decoder 15.

Simultaneously, the control circuit 11 supplies the reference level (the first reference voltage REF_A), read from the reference cell A in the data judging control circuit 17, to the sense amplifier 32 through the cascode circuit.

At this time, the control signal supplied the gate of the transistor 42 (FIG. 3) is set in the OFF state, the transistor 41 is set in the ON state, and the transistor 42 is set in the OFF state.

The verification current (I1) flows to the target memory cell 61, and the leak current (I2) flows to the neighboring memory cell 62.

When the control circuit 11 determines that the voltage of the bit line A side of the target memory cell 61 becomes equal to the first reference voltage REF_A, the first procedure is terminated.

Next, in the second procedure of the pattern dependence compensation method of FIG. 3, the voltage of the word line is made into the level in the program verification mode, the transistor 41 is set in the OFF state, and the leak current (I2) which is generated in the neighboring memory cell 62 is detected. Then, it is determined whether the detection voltage, which is produced from the detected leak current, exceeds the reference voltage REF_C for detection.

Figure 7:
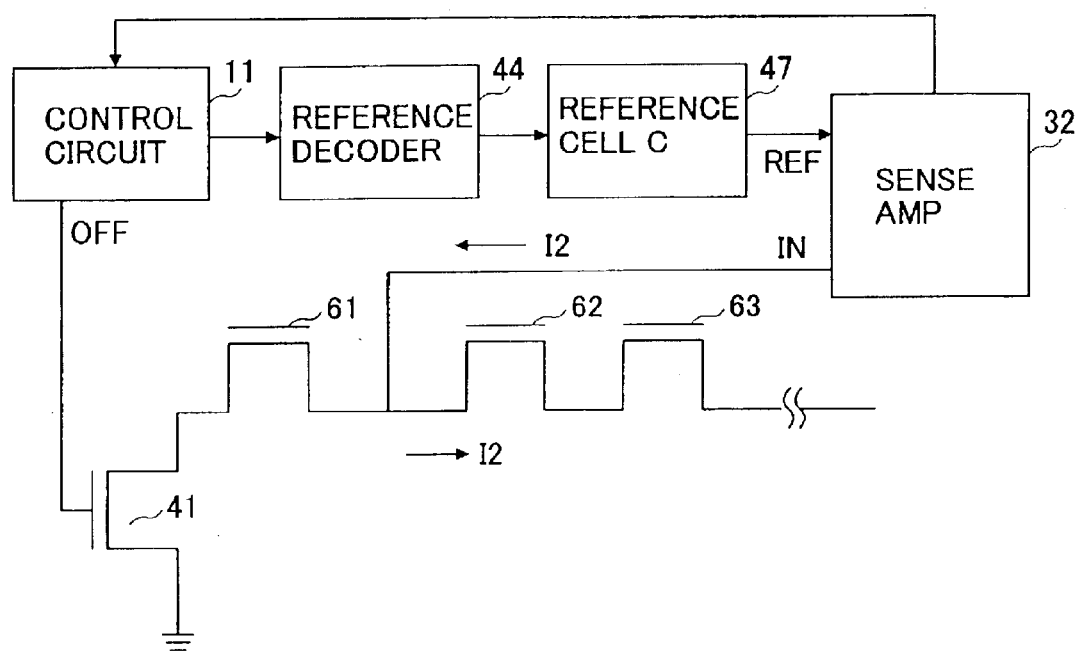
FIG. 7 is a diagram for explaining the second procedure of the pattern dependence compensation method of the present embodiment.

FIG. 7 is a diagram for explaining the second procedure of the pattern dependence compensation method of the present embodiment. Suppose that the reference cell decoder 44, the reference cell C 47, and the sense amplifier 32 in FIG. 7 are provided in the data judging control circuit 17 of FIG. 4.

In the second procedure, the control circuit 11 sets the control signal, supplied to the gate of the transistor 41, in the OFF state, and supplies the reference level (the reference voltage REF_C for detection), read from the reference cell C of the data judging control circuit 17, to the sense amplifier 32 through the cascode circuit. At this time, the control signal which is supplied to the gate of the transistor 42 (FIG. 3) is set in the OFF state. Namely, both the transistor 41 and the transistor 42 are set in the OFF state.

The voltage of the word line is maintained at the same potential as that of the first procedure (the level in the program verification mode).

The control circuit 11 detects the leak current (I2) of the neighboring memory cell 62 through the sense amplifier 32, and compares the detection voltage, which is produced from the detected leak current, and the reference voltage REF_C for detection.

In the second procedure, the bit line A of the target memory cell 61 is in the state already programmed to a certain amount of threshold level and the bit line A side of the target memory cell 61 is in the floating state, and the verification current (I1) does not affect the detection of the leak current (I2).

Furthermore, in the third procedure of the pattern dependence compensation method of FIG. 3, when it is determined from the result of comparison of the second procedure that the detection voltage (or the detected value of the leak current) exceeds the reference voltage REF_C for detection, the transistor 41 and the transistor 42 are set in the ON state, and a small compensation current (I3) from the current supplying circuit 43 is supplied to the bit line. The control unit it controls the transistors 41 and 42 and the current supplying circuit 43 so that the verification current to which the compensation current (I3) is added flows to the bit A of the target memory cell 61.

Thus, the target memory cell 61 is programmed to the target reference voltage (REF_B) by carrying out the program verification of the bit A of the target memory cell 61.

Figure 8:
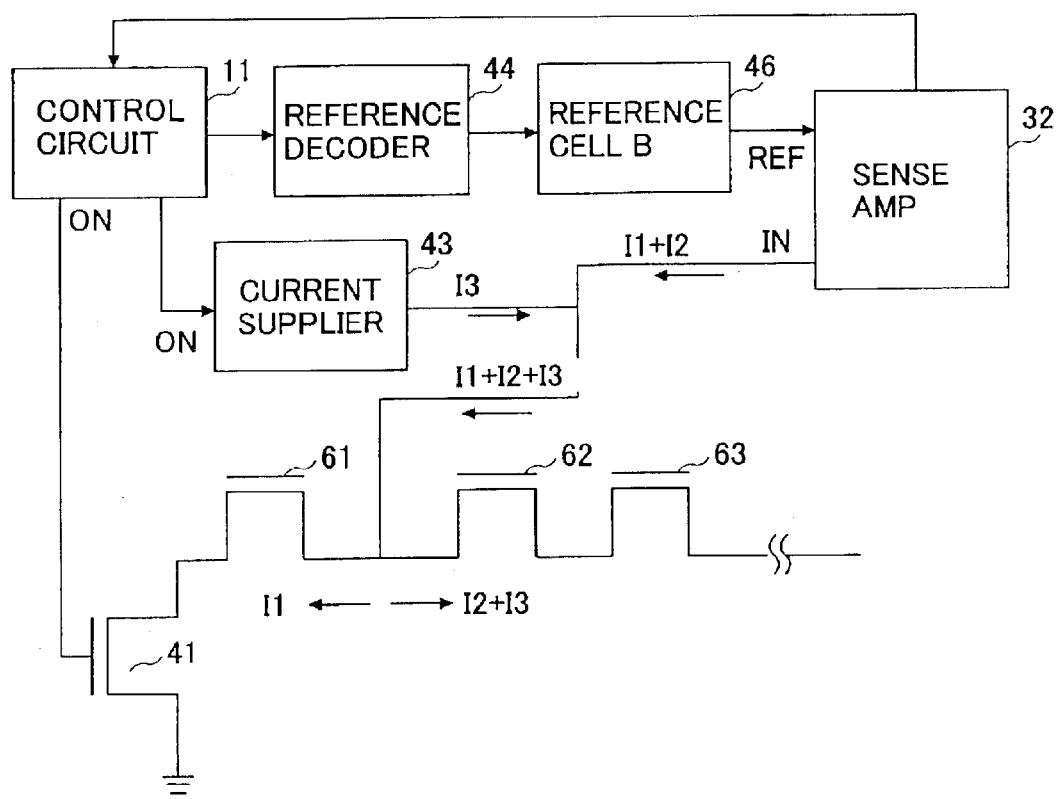
FIG. 8 is a diagram for explaining the third procedure of the pattern dependence compensation method of the present embodiment.

FIG. 8 is a diagram for explaining the third procedure of the pattern dependence compensation method of the present embodiment. Suppose that the reference cell decoder 44, the reference cell B 46, the current supplying circuit 43, and the sense amplifier 32 in FIG. 8 are provided in the data judging control circuit 17 of FIG. 4.

The current supplying circuit 43 of the present embodiment may be configured using a known circuit element. For example, the current supplying circuit 43 may be configured using two or more transistors that are connected in series and arranged in the diode connection formation, or using two or more resistors that are connected in series.

As shown in FIG. 8, in the third procedure, the control circuit 11 sets the control signal, supplied to the gate of the transistor 41, in the ON state, and activates the word line and the bit line of the target memory cell 61 through the X decoder 14 and the Y decoder 15.

At the time of program verification operation, the control circuit 11 supplies the reference level (or the target reference-voltage REF_B), read from the reference cell B of the data judging control circuit 17, to the sense amplifier 32 through the cascode circuit. Moreover, during the program verification operation, the control circuit 11 sets the control signal, supplied to the gate of the transistor 42, in the ON state, and supplies the small compensation current (I3) from the current supplying circuit 43 to the bit line of the target memory cell 61 through the source-drain channel of the transistor 42.

For example, the magnitude of the compensation current I3 supplied from the current supply circuit 43 is set to about 10 microampere. By adding the compensation current 13, it is possible for the non-volatile semiconductor memory device of the present embodiment to compensate the leak current I2 detected in the second procedure, and to compensate pattern dependence of the nonvolatile semiconductor memory device.

As described above, in the third procedure, both the transistor 41 and the transistor 42 are set in the ON state. The verification current (I1) flows to the target memory cell 61, and the leak current (I2+I3) to which the compensation current is added flows to the neighboring memory cell 62.

In the above-mentioned third procedure, the magnitude of the compensation current I3, which is added at the time of program verification operation, is made equal to the magnitude of the leak current I2 detected in the second procedure but the direction of the compensation current I3 is reversed to the direction of the leak current I2, so that the leak current (I2+I3) which flows to the neighboring memory cell 62 can be eliminated (I2+I3=0, i.e., I3=−I2).

Namely, when the leak current I2 flows from the bit line A side of the target memory cell to the bit H side of the neighboring memory cell, it is controlled so that the compensation current I3 flows into the current supplying circuit 43 from the bit line. Even when the magnitude of the compensation current I3 is slightly smaller than the magnitude of the leak current I2 detected in the second procedure, the influence of the leak current on the sense amplifier 32 can be remarkably reduced.

As described in the foregoing, in the nonvolatile semiconductor memory device of the present invention, when the leak current has occurred in the neighboring memory cell during the program verification mode, it is possible to compensate pattern dependence of the nonvolatile semiconductor memory device by externally supplying the compensation current, which compensates the leak current, to the bit line of the target memory cell. Hence, the influence by the leak current can be effectively reduced and the program verification current of the target memory cell can be read correctly.

In the nonvolatile semiconductor memory device that is configured to use the average current of the two reference cells as the reference current, the influence by the leak current generated in the neighboring memory cell can be effectively reduced, and the detection of the exact program verification current of the target memory cell is possible.

The present invention is not limited to the above-described embodiments, and variations and modifications may be made without departing from the scope of the present invention.

For example, although it is assumed that the leak current I2 flows in the direction of the bit H of the neighboring memory cells by the pattern dependence compensation method of the above-mentioned embodiment, even when the flowing direction of the leak current I2 is opposite to the above-mentioned direction, the pattern dependence compensation method of the present invention is also applicable.

Namely, what is necessary when the leak current I2 flows in the direction from the bit H side of the neighboring memory cells to the bit line A side of the target memory cell is just to control the current supplying circuit 43 so that the compensation current I3 from the current supplying circuit 43 flows into the bit line of the target memory cell.

What is claimed is:

1. A nonvolatile semiconductor memory device comprising:
- a memory cell array including memory cells and reference cells, the reference cells including a first reference cell and a second reference cell;
- a data judging control unit generating an average reference current based on a first reference current supplied from the first reference cell and a second reference current supplied from the second reference cell, the data judging control unit determining data of each of the memory cells by comparison of a read-out voltage of each of the memory cells with the average reference current;
- a control unit performing a program verification operation to each memory cell of the memory cell array; and
- a compensation current supplying unit supplying a compensation current to a bit line of a target memory cell of the memory cell array when a leak current of a neighboring memory cell adjacent to the target memory cell exceeds a predetermined reference value during the program verification operation of the control unit to the target memory cell, said compensation current compensating the leak current of the neighboring memory cell.

2. The nonvolatile semiconductor memory device according to claim 1 wherein the control unit includes a first control unit that performs a program operation to the target memory cell of the memory cell array until a first reference voltage that is lower than a target reference voltage is obtained.

3. The nonvolatile semiconductor memory device according to claim 2 wherein the control unit includes a second control unit that detects the leak current of the neighboring memory cell adjacent to the target memory cell during the program verification operation being performed to the target memory cell, and determines whether the detected leak current exceeds the predetermined reference value.

4. The nonvolatile semiconductor memory device according to claim 1 wherein the compensation current supplying unit includes a transistor connected to the bit line of the target memory cell and a current supply circuit connected to the transistor.

5. The nonvolatile semiconductor memory device according to claim 1 wherein the data judging control unit includes a program-verification reference cell that has a predetermined threshold value.

6. The nonvolatile semiconductor memory device according to claim 1 wherein the data judging control unit comprises:
- a first program-verification reference cell having a first threshold value used to set the first reference current;
- a second program-verification reference cell having a second threshold value used to set a target reference current; and
- a third reference cell having a threshold value used to detect the leak current of the neighboring memory cell.

7. The nonvolatile semiconductor memory device according to claim 6 wherein the first reference current set by the first program-verification reference cell is lower than the target reference current set by the second program-verification reference cell.

8. The nonvolatile semiconductor memory device according to claim 1 wherein each of the memory cells of the memory cell array is configured to store 2 bits of information by trapping charge in a charge-trap layer of a silicon nitride film.

* * * * *